United States Patent
Yamabuchi et al.

(10) Patent No.: US 7,538,426 B2
(45) Date of Patent: May 26, 2009

(54) COOLING SYSTEM OF POWER SEMICONDUCTOR MODULE

(75) Inventors: Hiroshi Yamabuchi, Tokyo (JP); Ryoji Nishiyama, Tokyo (JP); Yuji Kuramoto, Tokyo (JP); Satoshi Ishibashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 355 days.

(21) Appl. No.: 11/186,982

(22) Filed: Jul. 22, 2005

(65) Prior Publication Data

US 2006/0113661 A1 Jun. 1, 2006

(30) Foreign Application Priority Data

Nov. 30, 2004 (JP) .......................... P2004-345266

(51) Int. Cl.
H01L 23/34 (2006.01)

(52) U.S. Cl. .............. 257/714; 257/E23.098; 257/712; 257/715; 257/717; 347/21; 347/85; 324/158.1; 361/703

(58) Field of Classification Search ......... 257/E23.098, 257/706, 707, 712–717, 722, E23.08, 723; 347/21, 85; 324/760, 158.1; 361/703, 699
See application file for complete search history.

(56) References Cited

U.S. PATENT DOCUMENTS

| | | | | |
|---|---|---|---|---|
| 5,291,064 A | * | 3/1994 | Kurokawa | 257/714 |
| 5,368,786 A | * | 11/1994 | Dinauer et al. | 261/130 |
| 5,685,907 A | * | 11/1997 | Fujikawa et al. | 117/205 |
| 5,738,498 A | * | 4/1998 | Allington et al. | 417/53 |
| 5,755,559 A | * | 5/1998 | Allington et al. | 417/53 |
| 5,977,785 A | * | 11/1999 | Burward-Hoy | 324/760 |
| 6,071,408 A | * | 6/2000 | Allington et al. | 210/634 |
| 6,427,717 B1 | * | 8/2002 | Kimura | 137/340 |
| 6,542,365 B2 | * | 4/2003 | Inoue | 361/699 |
| 6,544,257 B2 | * | 4/2003 | Nagase et al. | 606/15 |
| 6,553,827 B2 | * | 4/2003 | McCormick | 73/196 |
| 6,590,633 B1 | * | 7/2003 | Nishi et al. | 355/53 |
| 6,992,382 B2 | * | 1/2006 | Chrysler et al. | 257/717 |
| 7,205,653 B2 | * | 4/2007 | Brandenburg et al. | 257/714 |
| 7,295,436 B2 | * | 11/2007 | Cheon | 361/699 |
| 7,309,453 B2 | * | 12/2007 | Chang et al. | 252/75 |
| 7,336,487 B1 | * | 2/2008 | Chrysler et al. | 361/699 |
| 2005/0180106 A1 | * | 8/2005 | Ohashi et al. | 361/699 |

FOREIGN PATENT DOCUMENTS

| | | |
|---|---|---|
| DE | 203 05 281 U1 | 11/2003 |
| EP | 0 550 850 B1 | 7/1993 |
| JP | 5-167283 A | 7/1993 |

(Continued)

Primary Examiner—Chris C. Chu
(74) Attorney, Agent, or Firm—Sughrue Mion, PLLC

(57) ABSTRACT

A cooling system of a power semiconductor module of the invention includes a temperature detection sensor provided in a semiconductor element as a heat source provided in a power semiconductor module, and a controller which estimates a change of a heat transfer coefficient from the power semiconductor module to cooling water based on output information Tj of the temperature detection sensor and drive output information Sr of a rotation speed detection sensor for a pump motor to drive a cooling pump, controls the pump motor according to this estimated result, and controls cooling capacity of the cooling water.

16 Claims, 4 Drawing Sheets

FOREIGN PATENT DOCUMENTS

| | | |
|---|---|---|
| JP | 08-153835 A | 6/1996 |
| JP | 2000-502516 A | 2/2000 |
| JP | 2002-184435 A | 6/2002 |
| JP | 2002-314280 A | 10/2002 |
| JP | 2004-87688 A | 3/2004 |
| JP | 2004-207458 A | 7/2004 |
| WO | WO 98/17089 A1 | 4/1998 |
| WO | WO 03/029731 A2 | 4/2003 |
| WO | WO 2004/042313 A1 | 5/2004 |

* cited by examiner

COOLING SYSTEM OF POWER SEMICONDUCTOR MODULE

BACKGROUND OF THE INVENTION

1. Field of the Invention

The present invention relates to a cooling system of a power semiconductor module, and particularly to a cooling system of a power semiconductor module in which a desirable temperature environment is realized and maintained by controlling the cooling capacity of a cooling fluid.

2. Description of the Related Art

Conventionally, in inverter devices using power semiconductors, there are many examples in which water-cooled or liquid-cooled cooling systems are applied for cooling.

In a related technique, a temperature sensor is fixed to a plate of a part to be cooled, and a control is perform such that the temperature of the plate is detected, and monitoring is performed as to whether the temperature exceeds a predetermined temperature, and in a case where the temperature of the plate exceeds the predetermined temperature, power supply is automatically cut off (see, for example, patent document 1).

[Patent document 1] Japanese Patent No. 2581367

As control means for the case where the detection temperature of the temperature sensor exceeds the predetermined temperature, in the case where the power supply is cut off, for example, in the case where a motor as a load of an electric vehicle or a hybrid vehicle is controlled, the behavior of the vehicle is rapidly changed, and there occurs a state which is not desirable for the driver.

Besides, there is known that in a heat exchange part where cooling is actually performed, the state of flow of cooling water has a great influence on a heat transfer coefficient.

SUMMARY OF THE INVENTION

The invention has been made in view of the above circumstances, and provides a cooling system of a power semiconductor module in which a change of a heat transfer coefficient from a power semiconductor module to a cooling fluid is estimated, and cooling capacity of the cooling fluid is controlled according to a result of this estimation, so that the operation of a load is suitably continued.

According to the invention, in a cooling system of a power semiconductor module including a cooling fluid pressurizing unit which pressurizes a cooling fluid and supplies it to a fluid flow path for circulation of cooling fluid to cool a power semiconductor module, and a drive unit which drives the cooling fluid pressurizing unit, a temperature detection unit is provided on a semiconductor element as a heat source provided in the power semiconductor module, and a control unit is provided which estimates a change of a heat transfer coefficient from the power semiconductor module to the cooling fluid based on output information of the temperature detection unit and drive output information of the drive unit to drive the cooling fluid pressurizing unit, and controls cooling capacity of the cooling fluid from this estimated result.

According to this invention, the change of the heat transfer coefficient from the power semiconductor module to the cooling fluid is estimated, and the cooling capacity of the cooling fluid is controlled according to the estimated result, so that the cooling system of the power semiconductor module can be obtained in which the operation of a load is suitably continued.

DETAILED DESCRIPTION OF THE INVENTION

EMBODIMENT 1

Figure 1A:
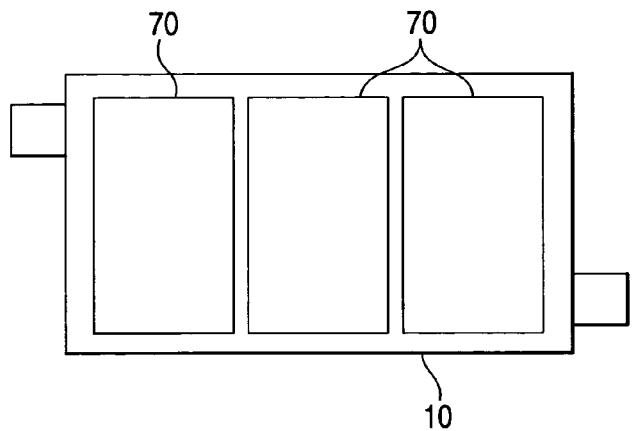
FIGS. 1A to 1D are trihedral views showing a structure of a heat sink part according to an embodiment of the invention.
Figure 1B:
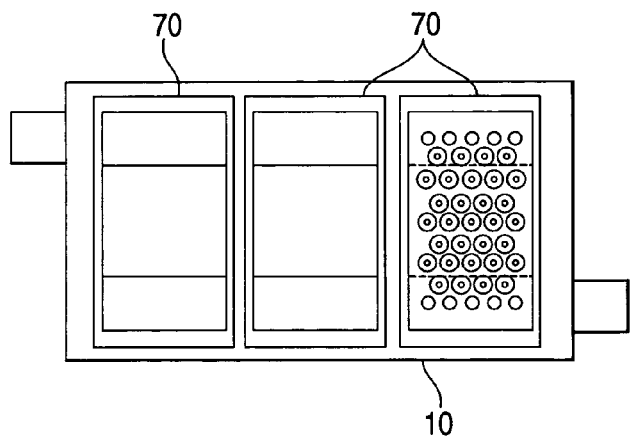
Figure 1C:
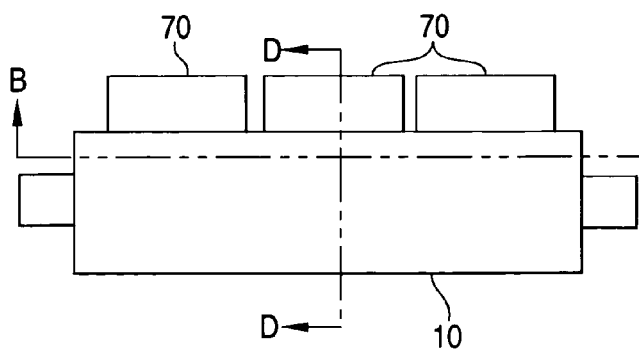
Figure 1D:
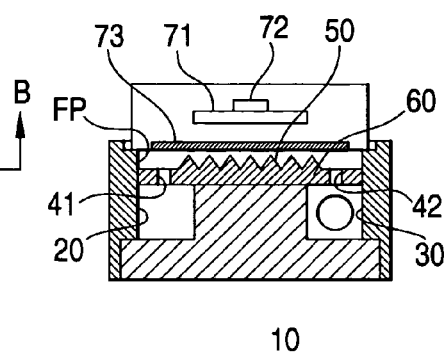
Figure 2:
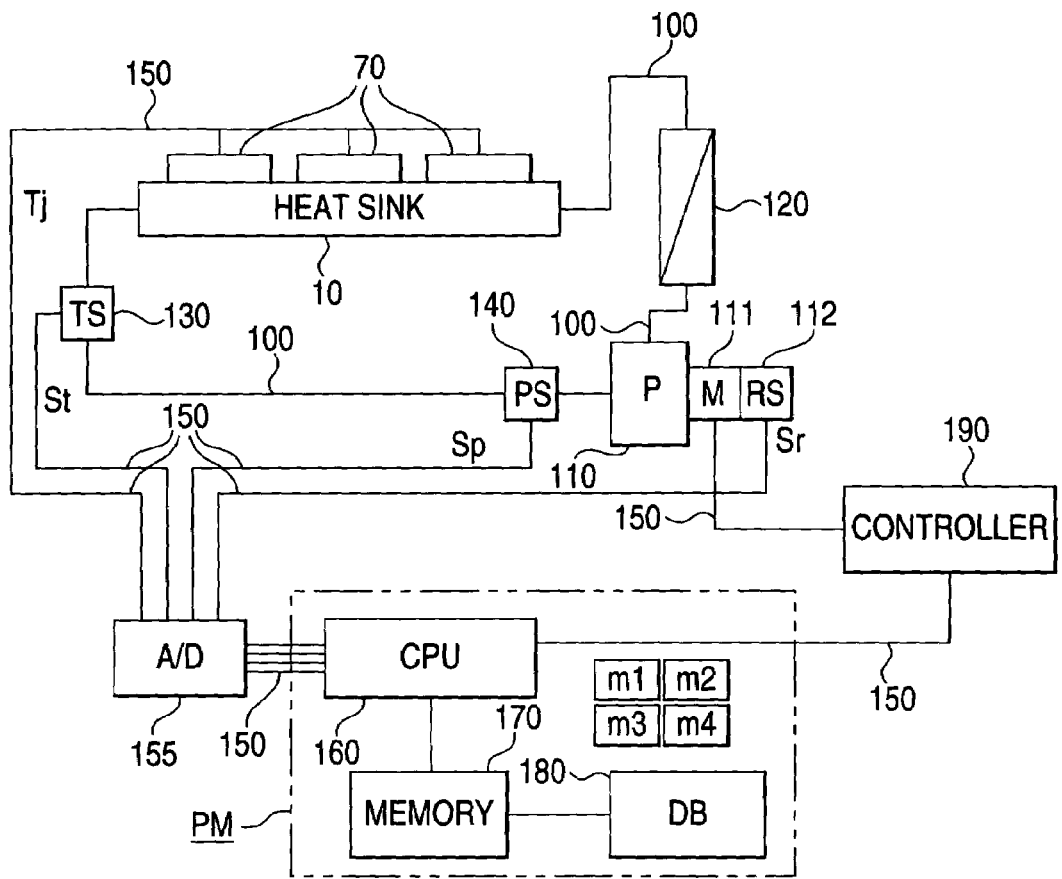
FIG. 2 is a block diagram showing a systematic structure of a cooling system of a power semiconductor module according to the embodiment of the invention.
Figure 3:
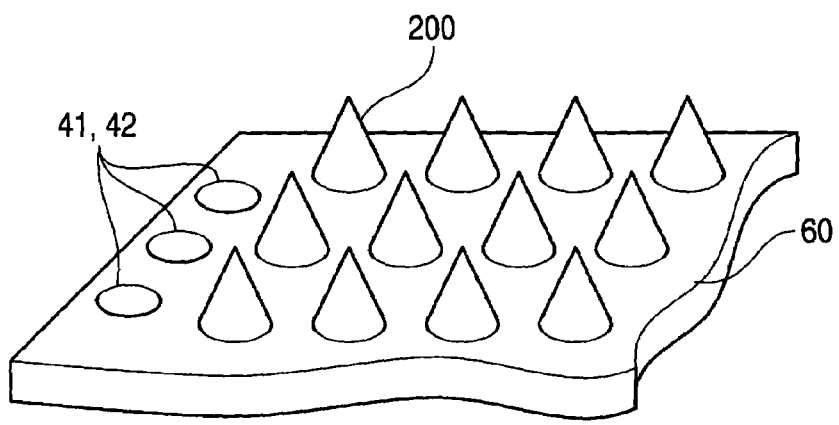
FIG. 3 is a perspective view showing the shape of a conical fin according to the embodiment of the invention.
Figure 4:
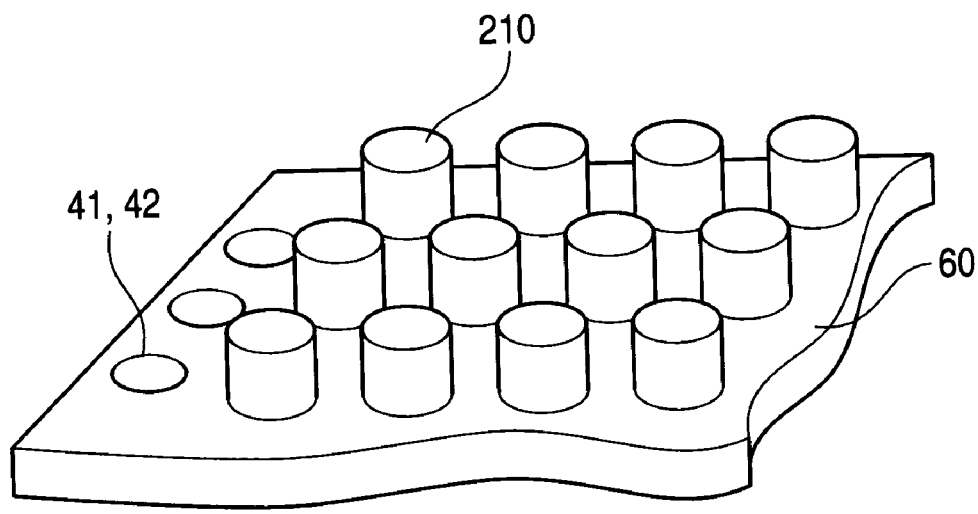
FIG. 4 is a perspective view showing the shape of a cylindrical fin according to the embodiment of the invention.
Figure 5:
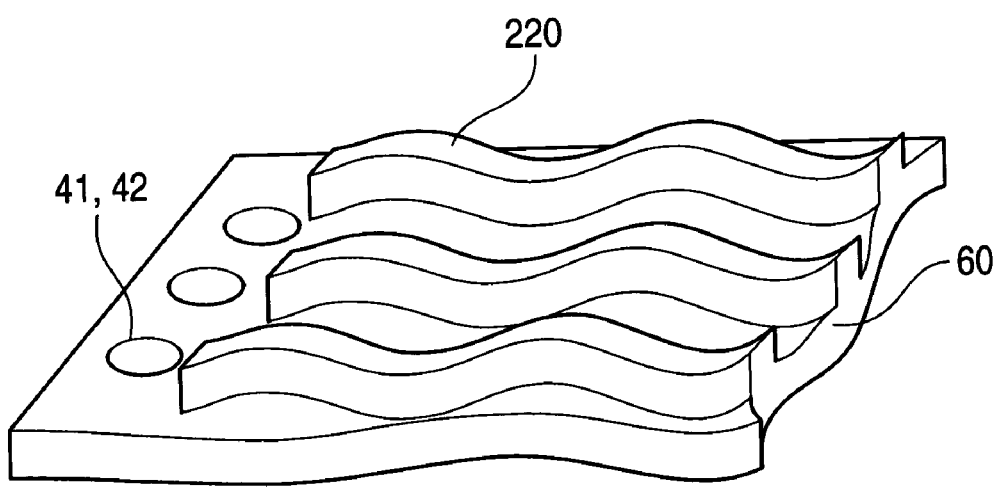
FIG. 5 is a perspective view showing the shape of a washboard-shaped fin according to the embodiment of the invention.
Figure 6:
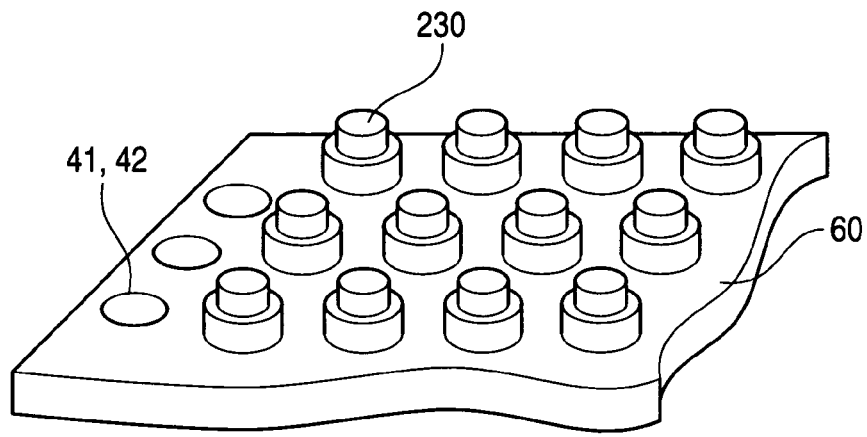
FIG. 6 is a perspective view showing the shape of a stepped cylindrical fin according to the embodiment of the invention.
Figure 7:
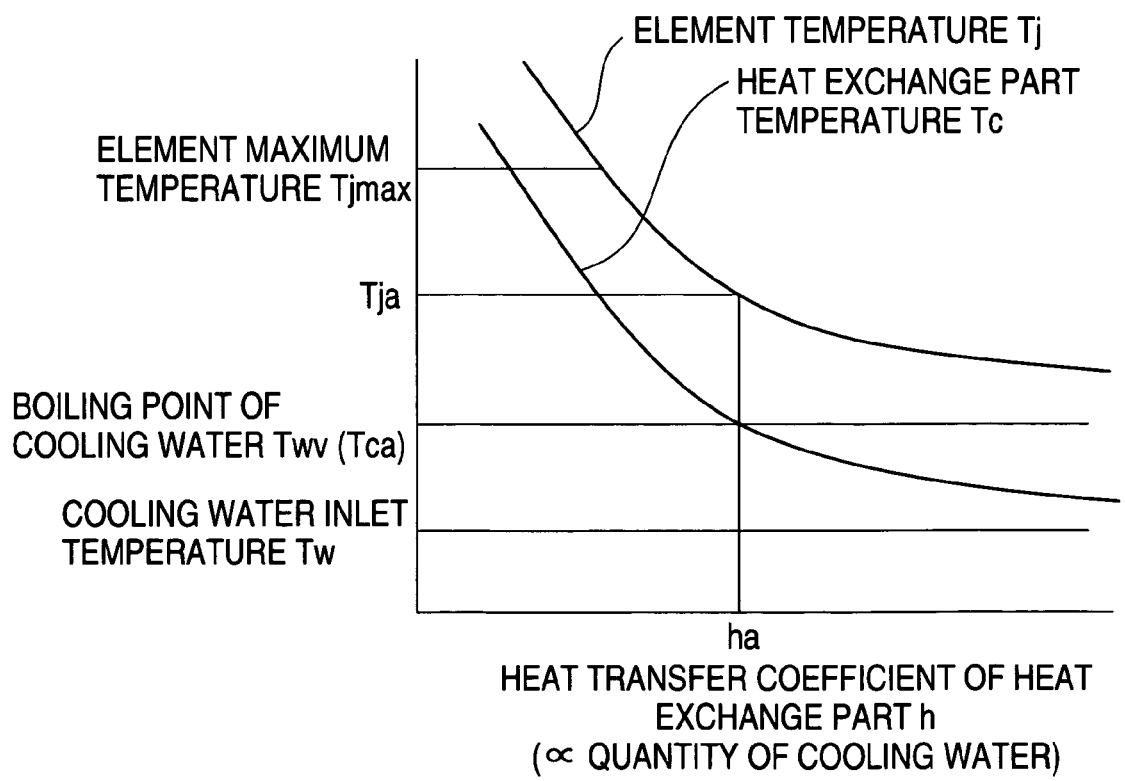
FIG. 7 is a characteristic curved line diagram showing relations between heat transfer coefficients and temperatures of respective parts in a cooling system according to the embodiment of the invention.

An embodiment of the invention will be described with reference to FIGS. 1 to 7. FIGS. 1A to 1D are trihedral views showing a structure of a heat sink part according to the embodiment of the invention. FIG. 1A is a plan view, FIG. 1B is a sectional view taken along line B-B of FIG. 1C, FIG. 1C is a side view, and FIG. 1D is a sectional view taken along line D-D of FIG. 1C. FIG. 2 is a block diagram showing a systematic structure of a cooling system of a power semiconductor module according to the embodiment of the invention. FIG. 3 is a perspective view showing the shape of a conical fin according to the embodiment of the invention. FIG. 4 is a perspective view showing the shape of a cylindrical fin according to the embodiment of the invention. FIG. 5 is a perspective view showing the shape of a washboard-shaped fin according to the embodiment of the invention. FIG. 6 is a perspective view showing the shape of a stepped cylindrical fin according to the embodiment of the invention. FIG. 7 is a characteristic curved line diagram showing relations between heat transfer coefficients and temperatures of respective parts in a cooling system according to the embodiment of the invention.

In FIGS. 1A to 1D showing the trihedral views around a heat sink in a power semiconductor cooling system, fluid flow paths 20 and 30 are formed in the inside of a heat sink 10 for cooling power semiconductor modules 70, and a plate 60 including orifices 41 and 42 and plural projection members 50 is fitted at a corresponding position for each of the power semiconductor modules 70 so as to cover the fluid flow paths 20 and 30.

A power semiconductor element 71 is embedded in the inside of the power semiconductor module 70, and further, a temperature detection sensor 72 is integrally incorporated in the inside of the element 71. A heat radiating surface 73 is formed at the bottom of the power semiconductor module 70. A fluid flow path FP is formed between the heat radiating surface 73 provided at the bottom of the power semiconductor module 70 and the plate 60 provided to cover the fluid flow paths 20 and 30. The fluid flow path FP communicates with the fluid flow path 20 through the orifice 41, and communicates with the fluid flow path 30 through the orifice 42. The plural projection members 50 provided on the plate 60 are opposite to the heat radiating surface 73 formed at the bottom of the power semiconductor module 70 through a cooling fluid including cooling water circulating through the fluid flow path FP.

The plural power semiconductor modules 70 are arranged side by side on the common heat sink 10, the fluid flow path FP of each of the power semiconductor modules 70 communicates with the common fluid flow paths 20 and 30, which are provided in the heat sink 10, through the orifices 41 and 42, and an equal quantity of cooling water is supplied to the respective power semiconductor modules 70 by the flow rate distribution function of the orifices 41 and 42.

In FIG. 2 showing the systematic diagram of the whole cooling system, cooling water as the cooling fluid circulates through the inside of a pipe 100, and a pump (P) 110, a radiator 120, the heat sink 10, a cooling water temperature sensor (TS) 130, and a pressure sensor (PS) 140 are connected to midpoints of a circulation flow path formed of the pipe 100.

A pump motor (M) 111 and a pump motor rotation speed detection sensor (RS) 112 are integrally attached to the pump (P) 110.

Further, detection signals generated from the cooling water temperature sensor (TS) 130, the cooling water pressure sensor (PS) 140, and the pump motor rotation speed detection sensor (RS) 112 are transmitted to an A/D converter 155 through a wiring 150, and the analog signals generated by the sensors 130, 140 and 112 are converted into digital signals. The converted digital signals pass through a wiring 150 and is transmitted to a CPU 160.

Here, a comparison judgment is made in the inside of the CPU 160 as to threshold values to be compared, such as a predetermined temperature value stored in a memory 170 or external information stored in a database (DB) 180, and according to the result of the judgment, an instruction signal to cause the rotation speed of the pump motor (M) 111 to become a predetermined rotation speed is transmitted to a controller 190 including an inverter through a wiring 150. The controller 190 having received the instruction supplies electric power to the pump motor (M) 111 to attain the predetermined rotation speed.

Next, an operation will be described.

When power is applied to the power semiconductor module 70, before the energization of the power semiconductor module 70, the instruction of the controller 190 is applied to the pump motor (M) 111 through the wiring 150, so that the pump motor (M) 111 is energized.

The pump (P) 110 is driven by the pump motor (M) 111, and the cooling fluid including cooling water flows through the pipe 100, passes through the fluid flow path FP provided in each of the plural power semiconductor modules 70 from the fluid flow path 20 as an inlet flow path provided in the heat sink 10 through the orifice 41, and is pressure-sent to the fluid flow path 30 as an outlet flow path through the orifice 42. The cooling water is circulated from the fluid flow path 30 through the radiator 120 to the pump (P) 110.

The cooling water circulates through the fluid flow paths 20, FP and 30 provided in the heat sink 10, and power is applied to the power semiconductor module 70 in the state where preparations for cooling are completed.

The controller 190 issues energization instructions to the power semiconductor modules 70 through the CPU 160 and the A/D converter 155.

When power is applied to the power semiconductor module 70 and the temperature of the power semiconductor module 70 rises by heat generation of the power semiconductor element 71 in the power semiconductor module 70, heat exchange is performed between the cooling water flowing through the fluid flow path FP from the fluid flow path 20 through the orifice 41 and flowing through the orifice 42 to the fluid flow path 30 and the heat radiating surface 73 of the power semiconductor module 70, and the power semiconductor module 70 including the power semiconductor element 71 as the heat source is cooled.

Here, swirls are generated by the projection members 50 provided on the plate 60 in the flow of the cooling water flowing between the heat radiating surface 73 of the power semiconductor module 70 and the plate 60 opposite to each other in the fluid flow path FP, the flow speed of the cooling water increases, and the heat exchange between the cooling water and the heat radiating surface 73 of the power semiconductor module 70 is efficiently performed.

The pressure of the cooling water supplied from the pump (P) 110 through the pipe 100 to the fluid flow paths 20, FP and 30 provided in the heat sink 10 is measured by the cooling water pressure sensor (PS) 140, and its detected pressure value Sp is data inputted to the A/D converter 155 through the wiring 150.

The temperature of the cooling Water supplied from the pump (P) 110 through the pipe 100 to the fluid flow paths 20, FP and 30 provided in the heat sink 10 is measured by the cooling water temperature sensor (TS) 130, and its detected temperature value St is data inputted to the A/D converter 155 through the wiring 150.

Further, the rotation speed of the pump motor (M) 111 for driving the pump (P) 110 is measured by the pump motor rotation speed detection sensor (RS) 112, and its detected pressure value Sr is inputted to the A/D converter 155 through the wiring 150.

The temperature of the power semiconductor element 71 in the power semiconductor module 70 is measured by the temperature detection sensor 72, and its detected temperature value Tj is inputted to the A/D converter 155 through the wiring 150.

Analog data including the detected values Sp, St, Sr and Tj inputted to the A/D converter 155 are converted into digital data by the A/D converter 155 and are inputted to the CPU 160.

The CPU 160, the memory 170 and the database (DB) 180 constitute an information processing apparatus PM, and this information processing apparatus PM performs, for example, an arithmetical operation of estimating, based on the digital data inputted to the CPU 160, a heat transfer coefficient from the heat radiating surface 73 of the power semiconductor module 70 to the cooling water passing through the fluid flow path FP and estimating the existence of boiling of the cooling water, and performs, as a control unit, an arithmetic processing as described below.

In the information processing apparatus PM, a heat transfer coefficient control unit (m1) is constructed which performs an arithmetic processing of judging the existence of boiling of the cooling water based on the detected temperature value Tj of the temperature sensor 72 to detect the temperature of the power semiconductor element 71 in the power semiconductor module 70, and the detected rotation speed Sr of the pump motor rotation speed detection sensor (RS) 112 to detect the rotation speed of the pump motor (M) 111 which drives the pump (P) 110. That is, the heat transfer coefficient control unit (m1) performs the arithmetic processing of converting the detected temperature value Tja of the temperature sensor 72 and the detected rotation speed Sr of the pump motor rotation speed detection sensor (RS) 112 by the A/D converter 155 from analog data to digital data, inputting the digital data to the CPU 160, estimating, based on the digital data, the heat transfer coefficient (h1) from the heat radiating surface 73 of the power semiconductor module 70 to the cooling water passing through the fluid flow paths 20, FP and 30 by the CPU 160, and judging the existence of boiling of the cooling water based on the estimated heat transfer coefficient (h1).

The heat transfer coefficient (h1) as the arithmetic operation result by the CPU 160 is stored in the memory 170, and is sent from the CPU 160 to the controller 190 as the arithmetic processing result by the heat transfer coefficient control unit (m1) in the information processing apparatus PM.

The controller 190 controls the pump motor (M) 111 to drive the pump (P) 110 according to the arithmetic processing result from the information processing apparatus PM. When the estimated heat transfer coefficient (h1) according to the arithmetic processing result derived from the information processing apparatus PM is smaller than a predetermined value, the rotation speed of the pump motor (M) 111 is increased to accelerate the pump (P) 110, and the cooling capacity of the cooling water circulating the pipe 100 is raised.

When the estimated heat transfer coefficient (h1) according to the arithmetic processing result derived from the information processing apparatus PM is larger than the predetermined value, the rotation speed of the pump motor (M) 111 is decreased to decelerate the pump (P) 110, and the cooling capacity of the cooling water circulating the pipe 100 is decreased.

In addition to the heat transfer coefficient control unit (m1) constructed of the information processing apparatus PM including the CPU 160, the memory 170 and the database (DB) 180, a correction function control unit (m2) constructed of the information processing apparatus PM including the CPU 160, the memory 170 and the database (DB) 180 is provided.

In the correction function control unit (m2) constructed of the information processing apparatus PM including the CPU 160, the memory 170 and the database (DB) 180, when the detected temperature value St from the cooling water temperature sensor (RS) 130 exceeds a predetermined value, there is performed a processing of correcting the estimated heat transfer coefficient (h1) as the arithmetic result of the heat transfer coefficient control unit (m1) in a descending direction to derive a corrected heat transfer coefficient (h2). Besides, when the detected pressure value Sp from the pressure sensor (PS) becomes lower than a predetermined value, there is performed a processing of correcting the estimated heat transfer coefficient (h1) as the arithmetic result of the heat transfer coefficient control unit (m1) in a descending direction to derive a corrected heat transfer coefficient (h2).

As stated above, when the estimated heat transfer coefficient (h1) as the arithmetic processing result of the heat transfer coefficient control unit (m1) constructed of the information processing apparatus PM including the CPU 160, the memory 170 and the database 180 is corrected by the correction function control unit (m2) constructed of the information processing apparatus PM including the CPU 160, the memory 170 and the database (DB) 180 and the corrected heat transfer coefficient (h2) is derived, the corrected heat transfer coefficient (h2) is transmitted from the CPU 160 through the wiring 150 to the controller 190, and the controller 190 performs the control of increasing the rotation speed of the pump motor (M) 111 according to the corrected heat transfer coefficient (h2) to accelerate the pump (P) 110, and increasing the cooling capacity of the cooling water circulating the pipe 100.

In addition to the heat transfer coefficient control unit (m1) constructed of the information processing apparatus PM including the CPU 160, the memory 170 and the database (DB) 180 and the correction function control unit (m2), a judgment unit (m3) constructed of the information processing apparatus PM including the CPU 160, the memory 170 and the database (DB) 180 and an adjustment unit (m4) are further provided.

In the judgment unit (m3) constructed of the information processing apparatus PM including the CPU 160, the memory 170 and the database (DB) 180, based on the corrected heat transfer coefficient (h2) obtained by correcting the estimated heat transfer coefficient (h1) as the arithmetic processing result of the heat transfer coefficient control unit (m1) by the correction function control unit (m2), or the temperature detected value of the cooling fluid temperature sensor (TS) 130, a temperature (t1) of a heat transfer surface including the heat radiating surface 73 where the power semiconductor module 70 comes in contact with the cooling water circulating through the fluid flow paths 20, FP and 30 is estimated by an arithmetical operation of the CPU 160, and the temperature estimated value (t1) of the heat transfer surface is compared with the boiling point of the cooling water circulating through the fluid flow paths 20, FP and 30. The boiling point of the cooling water circulating through the fluid flow paths 20, FP and 30 is stored as a known value in the memory 170 and the database (DB) 180, and the CPU 160 performs the comparison judgment processing of the temperature estimated value (t1) of the heat transfer surface and the boiling point of the cooling water.

The comparison judgment processing result of the judgment unit (m3) constructed of the information processing apparatus PM including the CPU 160, the memory 170 and the database (DB) 180 is sent to the adjustment unit (m4) constructed of the information processing apparatus PM including the CPU 160, the memory 170 and the database (DB) 180, and is sent to the controller 190 from the CPU 160 through the wiring 150.

The controller 190 performs such a control that based on the comparison judgment processing result, in the case where the temperature estimated value (t1) of the heat transfer surface is lower than the boiling point of the cooling water circulating through the fluid flow paths 20, FP and 30, the rotation speed of the pump motor (M) 111 is decreased to decelerate the pump (P) 110, and the cooling capacity of the cooling water circulating through the pipe 100 is reduced.

In the case where as the comparison judgment processing result, it is judged that the temperature estimated value (t1) of the heat transfer surface is higher than the boiling point of the cooling water circulating through the fluid flow paths 20, FP and 30, a control is performed to increase the rotation speed of the pump motor (M) 111 to accelerate the pump (P) 110, and to raise the cooling capacity of the cooling water circulating through the pipe 100.

Incidentally, in the heat transfer coefficient control unit (m1), the correction unit (m2), the judgment unit (m3) and the adjustment unit (m4), each of which is constructed of the information processing apparatus PM including the CPU 160, the memory 170 and the database (DB) 180, the function is performed by the hardware of the CPU 160, the memory 170 and the database (DB) 180 and the software as programs stored in the memory 170 in order to control the operation of the hardware of the information processing apparatus PM.

With respect to the state of occurrence of boiling of the cooling water in the cooling system of the power semiconductor module 70, a judgment of the existence of boiling will be described with reference to FIG. 7.

In general, the origin of the design of the cooling system as stated above is constructed while a heat resistant temperature Tjmax of the power semiconductor element 71 in the power semiconductor module 70 is made the starting point. However, in the case where the heat transfer coefficient of the heat exchange part as the heat transfer surface including the heat radiating surface 73 between the power semiconductor module 70 and the cooling water circulating through the fluid flow path FP is constructed to be relatively low, or in the case where the maximum temperature of an inlet temperature of the cooling water is set to be relatively high, even if the cooling to satisfy the element heat resistant temperature Tjmax is certainly performed, the temperature Tc of the cooling water at the heat exchange part actually can reach the boiling point Tca.

It is generally well known that as compared with the case where boiling does not occur, when the cooling water boils, abrasion of a structural member by erosion progresses in a part where disappearance of boiling bubbles concentratedly occur on the heating surface or downstream peripheral area. A hole is bored in the bottom of a pan since this erosion acts. Thus, there occurs a problem in endurance of the cooling system.

In the embodiment of the invention, in order to estimate the boiling of the cooling water, the heat sink 10 is designed such that when the detected temperature value Tj of the temperature sensor 72 incorporated in the power semiconductor element 71 of the power semiconductor module 70 is made, for example, the temperature Tja of the power semiconductor element 71 previously known in the case of a drive state of a certain specified load, the heat exchange part has a heat transfer coefficient ha.

The rotation speed of the pump motor (M) 111 to obtain the heat transfer coefficient ha is previously known (it can be obtained by the relation of the rotation speed of the pump motor $\propto$ cooling water pressure $\propto$ cooling water flow rate heat transfer coefficient h).

With respect to the inlet temperature Tw of the cooling water, the former element heat resistant temperature Tjmax is made the starting point, and the boiling point Twv of the cooling water is estimated from the relative relation of the heat transfer coefficient h, the heat radiation performance of the radiator 120, the temperature of the outer air, and air volume, and the maximum temperature TWmax of the cooling water is also regulated by design.

From these, in the operation of a normal load, from three pieces of information of (1) the drive state of the load by the power semiconductor element 71 in the power semiconductor module 70 is in a drive state with a predetermined load current value Ia, (2) the detected temperature value of the temperature sensor 72 to detect the temperature of the power semiconductor element 71 in the power semiconductor module 70 is Tja, and (3) the detected rotation speed of the pump motor rotation speed detection sensor (RS) to detect the rotation speed of the pump motor (M) 111 to drive the pump (P) 110 is Sr, the temperature Tca of the heat exchange part including the heat transfer surface on the heat radiating surface 73 of the power semiconductor module 70 corresponding to the heat transfer coefficient ha can be obtained by the arithmetical operation of the CPU 160. When the distribution of the temperature Tca in the heat exchange part as the arithmetic result with respect to the combination of the three parameters is recorded as a map in the memory 170, it is possible to always judge whether or not the cooling water boils.

That is, based on the detected temperature value Tj of the temperature sensor 72 to detect the temperature of the power semiconductor element 71 in the power semiconductor module 70 and the detected rotation speed Sr of the pump motor rotation speed detection sensor (RS) 112, the heat exchange part temperature Tc is calculated by the CPU 160, so that the characteristic data of the heat transfer coefficient h and the heat exchange part temperature Tc can be obtained on the basis of the heat transfer coefficient ha corresponding to the curved line of the heat exchange part temperature Tc in FIG. 7, and it is possible to easily make a judgment as to whether or not the cooling water boils.

Further, when the cooling water temperature sensor (TS) 130 and/or the cooling water pressure sensor (PS) 140 is provided at a midpoint in the pipe, it is possible to certainly detect the case where the cooling water exceeds a predetermined maximum temperature by some sort of reason, or the state where the cooling water does not circulate, and the fail safe function is ensured.

Next, the details of the projection members 50 provided on the plate 60 of the heat exchange part will be described with reference to FIGS. 3 to 6.

FIG. 3 shows the shape of a conical fin having a conical shape, and the bottoms of plural conical projection members 200 are jointed to the plate 60.

FIG. 4 shows a structure in which end faces of plural cylindrical fins 210 each made of a cylindrical projection member are jointed to the plate 60.

FIG. 5 shows a structure in which rib projection members 220 are made to meander with the wash board-shape and are jointed to the plate 60.

FIG. 6 shows a structure in which a large diameter side end face of a stepped cylindrical fin 230 made of a stepped cylindrical projection member is jointed to the plate 60.

In the embodiment of the invention, the control is performed such that the water temperature is detected and in the case where it exceeds the predetermined temperature, the rotation speed of the pump motor (M) 111 is increased to increase the water flow, and accordingly, it is unnecessary to cut off the power supply of the power semiconductor module 70 of the heat source, and consequently, it becomes possible to continue the operation of the load.

Besides, the heat transfer coefficient can be increased by providing the fins made of the projection members 50 to increase the water flow at the heat exchange part, and a larger amount of absorbed heat is obtained for the same pump consumed electric power, so that the cooling performance is improved.

Further, the orifices 41 and 42 are provided in the water path, so that the quantity of water at the heat exchange part in each of the plural power semiconductor modules 70 can be made equal, and the cooling performances for the plural heat sources can be uniformed.

Besides, the pump (P) 110 of the cooling water is previously driven at a stage before a load is driven, so that it is possible to prevent a structural member from melting due to an instantaneous temperature rise at the heat exchange part and a member from eroding and deteriorating due to boiling of the cooling water.

Similarly, by performing the estimation of the temperature of the cooling water at the heat exchange part, it becomes possible to prevent the boiling, and it is possible to prevent the melting of a structural member and the erosion and deterioration of a member due to the boiling of the cooling water.

The embodiment of the invention especially proposes to provide the feedback function in which the temperature sensor is not made independent, and based on the information of the temperature sensor integrally incorporated in the inside of the power semiconductor element, the predetermined temperature is monitored or estimated, and in the case where temperature exceeds the predetermined temperature, instead of instantaneously cutting off the power supply, the quantity of water of the cooling water system is increased, and the equivalent heat transfer coefficient is increased to maintain the predetermined temperature. Further, in this invention, the fins to improve the flow velocity by generating swirls in the flow at the heat exchange part are additionally provided, so that improvement in the efficiency of the heat exchange part is realized.

[1] According to the embodiment of the invention, in the cooling system of the power semiconductor module including the fluid flow paths 20, FP and 30 through which the cooling fluid including cooling water to cool the power semiconductor module 70 is circulated, the cooling fluid pressurizing unit which pressurizes the cooling fluid, supplies it to the fluid flow paths 20, FP and 30 and includes the pump (P) 110, and the drive unit including the pump motor (M) 111 to drive the cooling fluid pressurizing unit, the temperature detection unit including the temperature sensor 72 is provided in the semiconductor element 71 as the heat source provided in the power semiconductor module 70, and the change of the heat transfer coefficient (h) from the power semiconductor module 70 to the cooling fluid circulating through the fluid flow path FP is estimated based on the output information including the detected temperature value of the temperature detection unit and the drive output information including the detected rotation speed Sr from the pump motor rotation speed detection sensor (RS) 112 of the drive unit. Then, there is provided the control unit which controls the rotation speed of the pump motor (M) 111 through the controller 190 according to the estimated result, controls the cooling capacity of the cooling fluid circulating through the fluid flow paths 20, FP and 30, and includes the heat transfer coefficient control unit (m1) constructed of the information processing apparatus PM including the CPU 160, the memory 170 and the database (DB) 180. Accordingly, the cooling system of the power semiconductor module can be obtained in which the change of the heat transfer coefficient from the power semiconductor module to the cooling fluid is estimated, and the cooling capacity of the cooling fluid is controlled according to this estimated result, so that the operation of the load can be suitably continued.

[2] Besides, according to the embodiment of the invention, in the cooling system of the power semiconductor module including the heat sink 10 which includes the cooling fluid flow paths 20, FP and 30 for circulation of the cooling fluid including cooling water coming in contact with the heat radiating surface 73 of the power semiconductor module 70 and performs heat exchange between the power semiconductor module 70 and the cooling fluid, plural projection members 50 which are provided on the wall surface of the cooling fluid flow path FP opposite to the heat radiating surface 73 of the power semiconductor module 70 and generate swirls in the flow of the cooling fluid, the pump (P) 110 to pressure-send the cooling fluid to the cooling fluid flow path FP, the pump motor (M) 111 to drive the pump (P) 110, the rotation speed detection unit including the pump motor rotation speed detection sensor (RS) 112 to detect the rotation speed of the pump motor (M) 111, the radiator 120 to radiate heat received by the cooling fluid in the heat sink 10 to the outside, and the controller 190 to change the rotation speed of the pump motor (M) 111, the temperature detection unit including the temperature sensor 72 is provided in the heat generating element 71 in the inside of the power semiconductor module 70, and the change of the heat transfer coefficient (h) from the power semiconductor module 70 to the cooling fluid circulating through the fluid flow path FP is estimated based on the output information including the detected temperature value of the temperature detection unit, and the output information of the rotation speed of the pump motor (M) 111 from the rotation speed detection unit. Then, there is provided the control unit which controls the flow rate or supply pressure of the cooling fluid circulating through the fluid flow paths 20, FP and 30 by controlling the rotation speed of the pump motor (M) 111 to drive the cooling fluid pressurizing unit through the controller 190 according to the estimated result, and includes the heat transfer coefficient control unit (m1) constructed of the information processing apparatus PM including the CPU 160, the memory 170 and the database (DB) 180. Accordingly, the cooling system of the power semiconductor module can be obtained in which the change of the heat transfer coefficient from the power semiconductor module to the cooling fluid is estimated, and the cooling capacity of the cooling fluid is controlled according to this estimated result, so that the operation of the load is suitably continued, and further, swirls are generated in the flow of the cooling fluid by the projection members of predetermined shapes, and the heat exchange efficiency of the cooling fluid can be improved.

[3] Further, according to the embodiment of the invention, in the structure of the paragraph [2], as the projection members 50 to generate the swirls in the flow of the cooling fluid, at least one of the conical fin 200, the cylindrical fin 210, the washboard-shaped fin 220, and the multi-stage cylindrical fin 230 is provided. Accordingly, the cooling system of the power semiconductor module can be obtained in which the change of the heat transfer coefficient from the power semiconductor module to the cooling fluid is estimated, and the cooling capacity of the cooling fluid is controlled according to the estimated result, so that the operation of the load is suitably continued, and further, the swirls are generated in the flow of the cooling fluid by the projection members of the specific shapes including one of the conical fin, the cylindrical fin, the washboard-shaped fin, and the multi-stage cylindrical fin, and the heat exchange efficiency of the cooling fluid can be improved.

[4] Besides, according to the embodiment of the invention, in the structure of the paragraphs [1] to [3], at least one orifice 41, 42 is provided in the cooling fluid flow paths 20, FP and 30 in the power semiconductor module 70, which are provided in each of the plural power semiconductor modules 70 and through which the cooling fluid is circulated. Accordingly, the cooling system of the power semiconductor module is obtained in which the change of the heat transfer coefficient from the power semiconductor module to the cooling fluid is estimated, and the cooling capacity of the cooling fluid is controlled according to the estimated result, so that the operation of the load is suitably continued, and the flow path distribution of the cooling fluid can be suitably performed.

[5] Further, according to the embodiment of the invention, in the structure of the paragraphs [1] to [4], there are included the cooling fluid temperature detection unit including the cooling water temperature sensor (TS) 130 to detect the temperature of the cooling fluid and/or the pressure detection unit including the pressure sensor (PS) 140 to detect the pressure of the cooling fluid generated by the pump (P) 110, and the correction unit which uses the temperature detected value St of the cooling fluid temperature detection unit or the pressure detected value Sp of the pressure detection unit to correct the heat transfer coefficient (h) estimated from the detected value Tj of the temperature sensor 72, and includes the correction function control unit (m2) constructed of the information processing apparatus PM including the CPU 160, the memory 170, and the database (DB) 180. Accordingly, the cooling system of the power semiconductor module is obtained in which the change of the heat transfer coefficient from the power semiconductor module to the cooling fluid is estimated, and the cooling capacity of the cooling fluid is controlled according to the estimated result, so that the operation of the load is suitably continued, and further, the estimated heat transfer coefficient is corrected so that the fail safe function can be ensured.

[6] Besides, according to the embodiment of the invention, in the structure of the paragraphs [1] to [5], the control unit including the controller 190 is provided in which when power is applied to the power semiconductor module 70, the pump motor (M) 112 is energized before the power is applied to the power semiconductor module 70, and circulation of the cooling fluid is generated with priority by preferential driving of the pump (P) 100. Accordingly, the cooling system of the power semiconductor module can be obtained in which the change of the heat transfer coefficient from the power semiconductor module to the cooling fluid is estimated, and the cooling capacity of the cooling fluid is controlled according to the estimated result, so that the operation of the load is suitably continued, and further, the cooling function of the cooling fluid can be suitably performed.

[7] Besides, according to the embodiment of the invention, in the structure of the paragraph [5], there is provided the judgment unit which performs, based on the value of the heat transfer coefficient corrected by the correction unit of the heat transfer coefficient including the correction function control unit (m2) constructed of the information processing apparatus PM, an arithmetic operation to estimate the temperature of the heat transfer surface including the heat radiating surface 73 where the power semiconductor module 70 comes in contact with the cooling fluid, compares the estimated value of the temperature of the heat transfer surface with the value of the boiling point of the cooling fluid, and includes the judgment unit (m3) constructed of the information processing apparatus PM including the CPU 160, the memory 170 and the database (DB) 180. Accordingly, the cooling system of the power semiconductor module is obtained in which the change of the heat transfer coefficient from the power semiconductor module to the cooling fluid is estimated, and the cooling capacity of the cooling fluid is controlled according to the estimated result, so that the operation of the load is suitably continued, and further, the boiling state of the cooling fluid can be suitably detected based on the value of the corrected heat transfer coefficient.

[8] Besides, according to the embodiment of the invention, in the structure of the paragraph [5], there is provided the judgment unit which performs, based on the value of the fluid temperature St detected by the cooling fluid temperature detection unit including the cooling water temperature sensor (TS) 130, an arithmetic operation to estimate the temperature of the heat transfer surface including the heat radiating surface 73 where the power semiconductor module 70 comes in contact with the cooling fluid, compares the estimated value of the temperature of the heat transfer surface with the value of the boiling point of the cooling fluid, and includes the judgment unit (m3) constructed of the information processing apparatus PM including the CPU 160, the memory 170 and the database (DB) 180. Accordingly, the cooling system of the power semiconductor module is obtained in which the change of the heat transfer coefficient from the power semiconductor module to the cooling fluid is estimated, and the cooling capacity of the cooling fluid is controlled according to the estimated result, so that the operation of the load is suitably continued, and further, the boiling state of the cooling fluid can be suitably detected based on the cooling fluid temperature.

[9] Besides, according to the embodiment of the invention, in the structure of the paragraphs [7] and [8], there is provided the adjustment unit which controls the pressurization state of the cooling fluid pressurizing unit including the pump (P) 110 based on the judgment result of the judgment unit including the judgment unit (m3) constructed of the information processing apparatus PM, through the controller 190, and includes the adjustment unit (m4) constructed of the information processing apparatus PM including the CPU 160, the memory 170 and the database (DB) 180. Accordingly, the cooling system of the power semiconductor module is obtained in which the change of the heat transfer coefficient from the power semiconductor module to the cooling fluid is estimated, and the cooling capacity of the cooling fluid is controlled according to the estimated result, so that the operation of the load is suitably continued, and further, the boiling state of the cooling fluid can be suitably detected, and the pressurizing state of the cooling fluid pressurizing unit is controlled and the cooling capacity of the cooling fluid can be suitably controlled.

What is claimed is:

1. A cooling system of a power semiconductor module, comprising:
    a fluid flow path through which a cooling fluid to cool a power semiconductor module is circulated;
    a cooling fluid pressurizing unit which pressurizes the cooling fluid and supplies it to the fluid flow path;
    a drive unit to drive the cooling fluid pressurizing unit;
    a temperature detection unit provided in a semiconductor element as a heat source provided in the power semiconductor module;
    a control unit which estimates a change of a heat transfer coefficient from the power semiconductor module to the cooling fluid based on output information of the temperature detection unit and drive output information of the drive unit to drive the cooling fluid pressurizing unit, and controls cooling capacity of the cooling fluid according to an estimated result;
    a cooling fluid temperature detection unit to detect temperature of the cooling fluid; and
    a judgment unit which performs, based on a value of fluid temperature detected by the cooling fluid temperature detection unit, an arithmetic operation to estimate temperature of a heat transfer surface where the power semiconductor module comes in contact with the cooling fluid, and compares an estimated value of the temperature of the heat transfer surface with a value of boiling point of the cooling fluid.

2. A cooling system of a power semiconductor module according to claim 1, further comprising:
    a correction unit which uses a detected value of the cooling fluid temperature detection unit to correct the heat transfer coefficient estimated from a detected value of the temperature detection unit of the power semiconductor module.

3. A cooling system of a power semiconductor module according to claim 1, further comprising:
    a pressure detection unit to detect pressure of the cooling fluid generated by the cooling fluid pressurizing unit;
    a correction unit which uses a detected value of the pressure detection unit to correct the heat transfer coefficient estimated from a detected value of the temperature detection unit of the power semiconductor module.

4. A cooling system of a power semiconductor module according to claim 1, further comprising an adjustment unit which controls a pressurization state of the cooling fluid pressurizing unit based on a judgment result of the judgment unit.

5. A cooling system of a power semiconductor module comprising:
    a heat sink which includes a cooling fluid flow path through which a cooling fluid coming in contact with a heat radiating surface of a power semiconductor module is circulated and performs heat exchange between the power semiconductor module and the cooling fluid;
    plural projection members which are provided on a wall surface of the cooling fluid flow path opposite to the heat radiating surface of the power semiconductor module and generate swirls in a flow of the cooling fluid;
    a pump to pressure-send the cooling fluid to the cooling fluid flow path;
    a pump motor to drive the pump;
    a rotation speed detection unit to detect a rotation speed of the pump motor;
    a radiator to radiate heat received by the cooling fluid in the heat sink to outside air;
    a controller to change the rotation speed of the pump motor;
    a temperature detection unit provided in a heat generating element in the inside of the power semiconductor module; and
    a control unit which estimates a change of a heat transfer coefficient from the power semiconductor module to the cooling fluid based on output information of the temperature detection unit and output information of the rotation speed of the pump motor from the rotation speed detection unit, and controls a flow rate or a supply pressure of the cooling fluid according to an estimated result.

6. A cooling system of a power semiconductor module according to claim 5, wherein the projection members to generate the swirls are conical fins.

7. A cooling system of a power semiconductor module according to claim 5, wherein the projection members to generate the swirls are cylindrical fins.

8. A cooling system of a power semiconductor module according to claim 5, wherein the projection members to generate the swirls are washboard-shaped fins.

9. A cooling system of a power semiconductor module according to claim 5, wherein the projection members to generate the swirls are multi-stage cylindrical fins.

10. A cooling system of a power semiconductor module according to claim 5, wherein at least one orifice is provided in the cooling fluid flow path.

11. A cooling system of a power semiconductor module, comprising:
    a fluid flow path through which a cooling fluid to cool a power semiconductor module is circulated;
    a cooling fluid pressurizing unit which pressurizes the cooling fluid and supplies it to the fluid flow path;
    a drive unit to drive the cooling fluid pressurizing unit;
    a temperature detection unit provided in a semiconductor element as a heat source provided in the power semiconductor module;
    a control unit which estimates a change of a heat transfer coefficient from the power semiconductor module to the cooling fluid based on output information of the temperature detection unit and drive output information of the drive unit to drive the cooling fluid pressurizing unit, and controls cooling capacity of the cooling fluid according to an estimated result; and
    a second control unit which, when power is applied to the power semiconductor module, energizes the drive unit before the power is applied to the power semiconductor module, and generates circulation of the cooling fluid.

12. A cooling system of a power semiconductor module, comprising:
    a fluid flow path through which a cooling fluid to cool a power semiconductor module is circulated;
    a cooling fluid pressurizing unit which pressurizes the cooling fluid and supplies it to the fluid flow path;
    a drive unit to drive the cooling fluid pressurizing unit;
    a temperature detection unit provided in a semiconductor element as a heat source provided in the power semiconductor module;
    a control unit which estimates a change of a heat transfer coefficient from the power semiconductor module to the cooling fluid based on output information of the temperature detection unit and drive output information of the drive unit to drive the cooling fluid pressurizing unit, and controls cooling capacity of the cooling fluid according to an estimated result;
    a cooling fluid temperature detection unit to detect temperature of the cooling fluid;
    a correction unit which uses a detected value of the cooling fluid temperature detection unit to correct the heat transfer coefficient estimated from a detected value of the temperature detection unit of the power semiconductor module; and
    a judgment unit which performs, based on a value of the heat transfer coefficient corrected by the correction unit of the heat transfer coefficient, an arithmetic operation to estimate temperature of a heat transfer surface where the power semiconductor module comes in contact with the cooling fluid, and compares an estimated value of the temperature of the heat transfer surface with a value of boiling point of the cooling fluid.

13. A cooling system of a power semiconductor module according to claim 12, further comprising an adjustment unit which controls a pressurization state of the cooling fluid pressurizing unit based on a judgment result of the judgment unit.

14. A cooling system of a power semiconductor module, comprising:
    a fluid flow path through which a cooling fluid to cool a power semiconductor module is circulated;
    a cooling fluid pressurizing unit which pressurizes the cooling fluid and supplies it to the fluid flow path;
    a drive unit to drive the cooling fluid pressurizing unit;
    a temperature detection unit provided in a semiconductor element as a heat source provided in the power semiconductor module;
    a control unit which estimates a change of a heat transfer coefficient from the power semiconductor module to the cooling fluid based on output information of the temperature detection unit and drive output information of the drive unit to drive the cooling fluid pressurizing unit, and controls cooling capacity of the cooling fluid according to an estimated result;
    a pressure detection unit to detect pressure of the cooling fluid generated by the cooling fluid pressurizing unit;
    a correction unit which uses a detected value of the pressure detection unit to correct the heat transfer coefficient estimated from a detected value of the temperature detection unit of the power semiconductor module; and
    a judgment unit which performs, based on a value of the heat transfer coefficient corrected by the correction unit of the heat transfer coefficient, an arithmetic operation to estimate temperature of a heat transfer surface where the power semiconductor module comes in contact with the cooling fluid, and compares an estimated value of the temperature of the heat transfer surface with a value of boiling point of the cooling fluid.

15. A cooling system of a power semiconductor module according to claim 14, further comprising an adjustment unit which controls a pressurization state of the cooling fluid pressurizing unit based on a judgment result of the judgment unit.

16. A cooling system of a power semiconductor module, comprising:
- a heat sink which includes a cooling fluid flow path through which a cooling fluid coming in contact with a heat radiating surface of a power semiconductor module is circulated and performs heat exchange between the power semiconductor module and the cooling fluid;
- a cooling fluid pressurizing unit which pressurizes the cooling fluid and supplies it to the fluid flow path;
- a drive unit to drive the cooling fluid pressurizing unit;
- a temperature detection unit provided in a semiconductor element as a heat source provided in the power semiconductor module;
- a control unit which estimates a change of a heat transfer coefficient from the power semiconductor module to the cooling fluid based on output information of the temperature detection unit and drive output information of the drive unit to drive the cooling fluid pressurizing unit, and controls cooling capacity of the cooling fluid according to an estimated result;
- a cooling fluid temperature detection unit to detect temperature of the cooling fluid; and
- a judgment unit which performs, based on a value of fluid temperature detected by the cooling fluid temperature detection unit, an arithmetic operation to estimate temperature of a heat transfer surface where the power semiconductor module comes in contact with the cooling fluid, and compares an estimated value of the temperature of the heat transfer surface with a value of boiling point of the cooling fluid.

* * * * *